United States Patent
Sizemore et al.

(10) Patent No.: US 9,799,973 B2
(45) Date of Patent: Oct. 24, 2017

(54) CIRCUIT BOARD PAD LAYOUT AND MECHANICAL RETAINER

(71) Applicant: Ross Video Limited, Iroquois (CA)

(72) Inventors: Donald Mark Sizemore, Virginia Beach, VA (US); Curtis Rylee Keim, Virginia Beach, VA (US); Nicholas Daniel Parry, Boronia (AU); Mark Justin Sonderegger, Ottawa (CA); Thomas Curtis Brown, Virginia Beach, VA (US)

(73) Assignee: ROSS VIDEO LIMITED, Iroquois (CA)

(*) Notice: Subject to any disclaimer, the term of this patent is extended or adjusted under 35 U.S.C. 154(b) by 0 days.

(21) Appl. No.: 15/259,144

(22) Filed: Sep. 8, 2016

(65) Prior Publication Data
US 2017/0069990 A1    Mar. 9, 2017

Related U.S. Application Data

(60) Provisional application No. 62/215,687, filed on Sep. 8, 2015.

(51) Int. Cl.
| | |
|---|---|
| *H01R 12/00* | (2006.01) |
| *H01R 12/73* | (2011.01) |
| *H01R 12/70* | (2011.01) |
| *H05K 1/11* | (2006.01) |
| *H05K 3/36* | (2006.01) |

(52) U.S. Cl.
CPC ....... *H01R 12/737* (2013.01); *H01R 12/7047* (2013.01); *H05K 1/117* (2013.01); *H05K 3/366* (2013.01); *H05K 2201/048* (2013.01); *H05K 2201/10409* (2013.01); *H05K 2201/209* (2013.01); *H05K 2203/167* (2013.01)

(58) Field of Classification Search
CPC ......................... H01R 12/737; H01R 12/7047; H01K 1/0245
USPC .......................................................... 439/62
See application file for complete search history.

(56) References Cited

U.S. PATENT DOCUMENTS

| | | | |
|---|---|---|---|
| 4,906,197 A * | 3/1990 | Noll ..................... | G02B 6/3817 385/56 |
| 5,002,493 A * | 3/1991 | Brown ................. | H05K 7/1428 29/848 |
| 5,013,248 A * | 5/1991 | Brown ................. | H05K 7/1428 29/883 |
| 5,535,100 A * | 7/1996 | Lubahn ................... | G06F 1/184 361/752 |
| 5,964,611 A * | 10/1999 | Jacob ................... | H01R 13/639 439/372 |

(Continued)

*Primary Examiner* — Tho D Ta
*Assistant Examiner* — Nader Alhawamdeh
(74) *Attorney, Agent, or Firm* — Wolf, Greenfield & Sacks, P.C.

(57) ABSTRACT

Printed circuit board pad layouts and mechanical retainers are disclosed herein. For example, a printed circuit board is disclosed having a row of electrically conductive pads, the row of pads including pairs of signal pads with exactly one reference pad interposed between each pair of the signal pads. As another example, a mechanical retainer is disclosed that may assist in interconnecting two printed circuit boards and that has a longitudinal body with a threaded end, a head at an end opposite the threaded end, and a shank connecting the head to the threaded end.

20 Claims, 11 Drawing Sheets

(56) References Cited

U.S. PATENT DOCUMENTS

| | | | | |
|---|---|---|---|---|
| 6,093,046 A * | 7/2000 | Chiou | ................ | H01R 12/7005 |
| | | | | 439/378 |
| 6,285,563 B1 * | 9/2001 | Nelson | ................. | H05K 7/1445 |
| | | | | 174/254 |
| 6,884,937 B1 * | 4/2005 | Mistry | ................. | G02B 6/3897 |
| | | | | 174/353 |
| 6,982,481 B1 * | 1/2006 | Sonderegger | ....... | H01L 23/4006 |
| | | | | 257/659 |
| 7,115,821 B1 * | 10/2006 | Sonderegger | ........ | G02B 6/4201 |
| | | | | 174/520 |
| 8,439,057 B2 * | 5/2013 | Parry | ....................... | A45B 9/00 |
| | | | | 135/66 |
| 2002/0177370 A1 * | 11/2002 | Abbott | ............... | H01R 13/2421 |
| | | | | 439/700 |
| 2003/0003809 A1 * | 1/2003 | Maiers | ................ | G11B 25/043 |
| | | | | 439/629 |
| 2003/0109180 A1 * | 6/2003 | Mueller | ............. | H01R 13/6315 |
| | | | | 439/680 |
| 2007/0037434 A1 * | 2/2007 | Fedder | ............... | H01R 12/7005 |
| | | | | 439/378 |
| 2014/0273551 A1 * | 9/2014 | Resendez | ............. | H01R 12/737 |
| | | | | 439/65 |

* cited by examiner

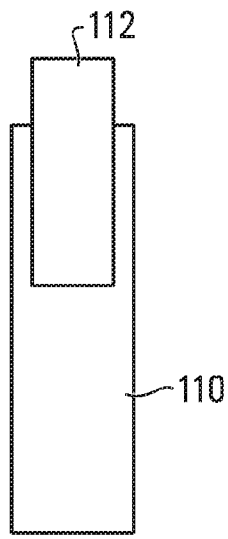
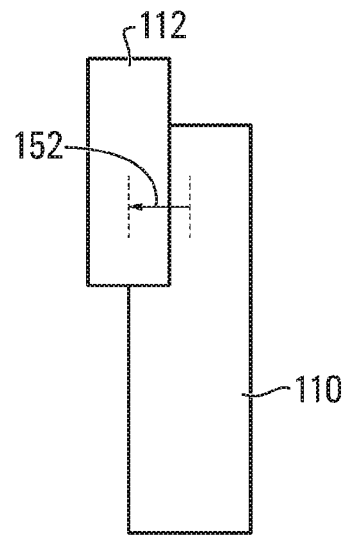
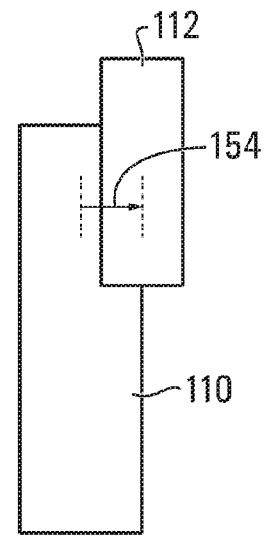
FIG. 5A   FIG. 5B   FIG. 5C
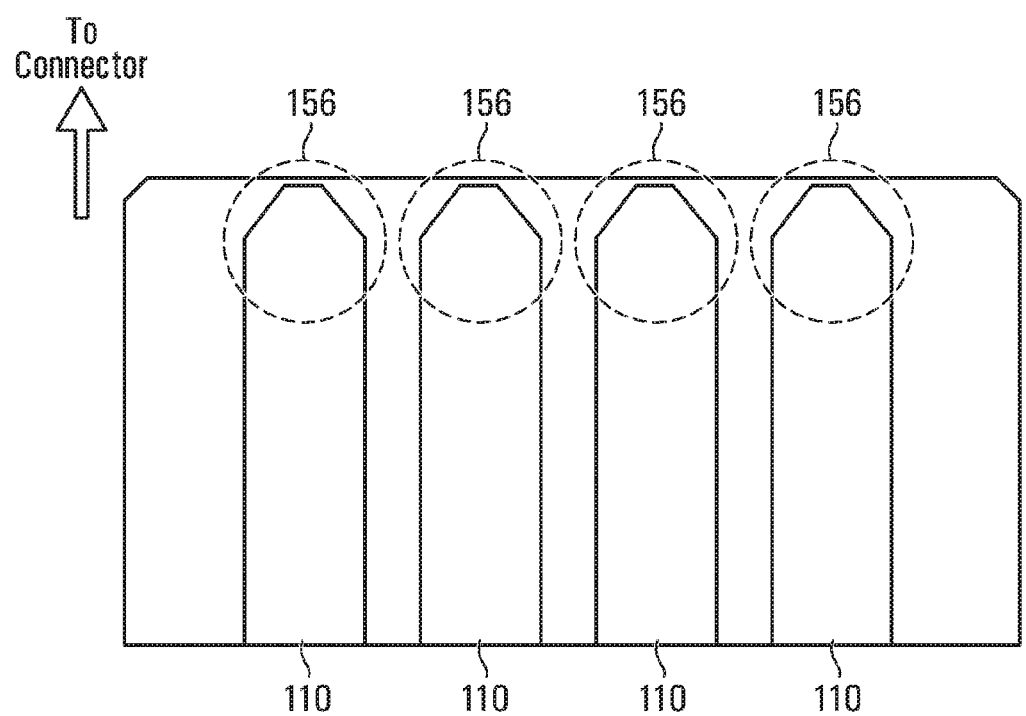
FIG. 6

CIRCUIT BOARD PAD LAYOUT AND MECHANICAL RETAINER

PRIORITY CLAIM

This application claims priority to U.S. Provisional Patent Application Ser. No. 62/215,687, filed on Sep. 8, 2015, which is incorporated herein by reference.

FIELD

The present application relates to the interconnection of printed circuit boards.

BACKGROUND

When one printed circuit board (PCB) is interconnected to another PCB, a connector may be used. As an example, two PCBs may be interconnected or "mated" through one or more card-edge connectors.

In some applications, a first PCB may be mated to a second PCB that is perpendicular to the first PCB, such as when a card is connected to a perpendicular backplane or midplane through one-piece card-edge connectors.

When designing an interconnection between two PCBs using connectors, different design factors may come into play. In particular, as data signal speeds increase (e.g. data rates greater than 10 gigabits per second), signal path impedance and crosstalk may become greater factors in the design. Other design considerations may include tolerance of the materials, signal density, mating accuracy, and isolation from other signal and noise sources within the system and externally.

SUMMARY

Printed circuit board pad layouts and mechanical retainers are disclosed herein. For example, a printed circuit board is disclosed having a row of electrically conductive pads, the row of pads including pairs of signal pads with exactly one reference pad interposed between each pair of the signal pads. As another example, a mechanical retainer is disclosed that may assist in interconnecting two printed circuit boards and that has a longitudinal body with a threaded end, a head at an end opposite the threaded end, and a shank connecting the head to the threaded end.

According to one embodiment, there is provided an apparatus including a printed circuit board having a leading edge and an opposite trailing edge. There is at least one row of electrically conductive pads at the leading edge of the printed circuit board. The apparatus further includes a mechanical retainer having a longitudinal body comprising a shank extending between a head and a threaded end. The head is at the trailing edge of the printed circuit board, and the threaded end is at the leading edge of the printed circuit board.

In some embodiments, the shank of the mechanical retainer includes two axially spaced and radially extending abutment surfaces. In some embodiments, a bracket is connected to the printed circuit board, and the bracket limits movement of one of the abutment surfaces of the mechanical retainer in a direction away from the leading edge of the printed circuit board, and the bracket also limits movement of the other abutment surface of the mechanical retainer in a direction towards the leading edge of the printed circuit board. In some embodiments, the bracket also receives and supports the mechanical retainer. In some embodiments, the bracket has an inset sidewall forming an abutment face in a plane perpendicular to a longitudinal axis of the shank. In some embodiments, the inset sidewall limits the movement of the one abutment surface of the mechanical retainer in the direction away from the leading edge of the printed circuit board.

In some embodiments, the shank of the mechanical retainer comprises an annular groove defined between the two axially spaced and radially extending abutment surfaces. The bracket may define a channel, and the annular groove of the shank may be seated in the channel.

In some embodiments, the bracket is connected to the printed circuit board adjacent the leading edge of the printed circuit board. In some embodiments, one abutment surface of the shank of the mechanical retainer is adjacent the threaded end of the mechanical retainer.

In some embodiments, the printed circuit board has a plurality of tongues at the leading edge of the printed circuit board. Each tongue of the plurality of tongues may include a row of the electrically conductive pads at the leading edge. The mechanical retainer may be interposed between two tongues.

In some embodiments, the apparatus further includes a plate at the trailing edge of the printed circuit board. The plate may have an aperture that exposes the head of the mechanical retainer and that supports the mechanical retainer at the trailing edge of the printed circuit board.

In some embodiments, the shank has at least one recessed portion or groove to accommodate a circuit component mounted on the printed circuit board.

In some embodiments, at least some of the electrically conductive pads comprise: pairs of signal pads with exactly one reference pad interposed between each pair of the signal pads. In some embodiments, each of the pairs of the signal pads is to transmit a differential data signal. In some embodiments, each reference pad is connected to ground or power. In some embodiments, for at least one pair of the signal pads, each signal pad of the at least one pair has a pad area that is smaller than a pad area of an adjacent reference pad. In some embodiments, each signal pad of the at least one pair has a pad length that is shorter than a pad length of the adjacent reference pad. In some embodiments, the adjacent reference pad is closer to the leading edge than each signal pad of the at least one pair. In some embodiments, each signal pad of the at least one pair of signal pads has a pad width that is smaller than a pad width of the adjacent reference pad. In some embodiments, each signal pad of the at least one pair of signal pads has a notch at a leading edge of the signal pad. The notch may have an inverted triangle shape or a scalloped shape.

In some embodiments, the printed circuit board has a gap between a first pair of signal pads and a second pair of signal pads. The gap has no signal pads and includes exactly one reference pad, and the gap is more than 2.5 times the width of a signal pad in any of the first pair and the second pair.

In another embodiment, there is provided a kit including: (1) a printed circuit board having a leading edge and an opposite trailing edge, and at least one row of electrically conductive pads at the leading edge of the printed circuit board; and (2) a mechanical retainer having a longitudinal body comprising a shank extending between a head and a threaded end. The head is for placement at the trailing edge of the printed circuit board, and the threaded end is for placement at the leading edge of the printed circuit board. In some embodiments, the shank of the mechanical retainer includes two axially spaced and radially extending abutment surfaces. In some embodiments, the kit further includes a bracket for connection to the printed circuit board. The bracket is to limit movement of one of the abutment surfaces of the mechanical retainer in a direction away from the leading edge of the printed circuit board, and the bracket is also to limit movement of the other abutment surface of the mechanical retainer in a direction towards the leading edge of the printed circuit board.

In another embodiment, there is provided a mechanical retainer having a longitudinal body comprising a threaded end, a head at an end opposite the threaded end, and a shank connecting the head to the threaded end. The shank may have two axially spaced and radially extending abutment surfaces located closer to the threaded end of the retainer than the head of the retainer. One of the abutment surfaces may be adjacent the threaded end. The mechanical retainer may further include an annular groove in the shank between the two abutment surfaces. The annular groove may define the two abutment surfaces. In some embodiments, the head is shaped to be rotated by a tool or by hand, and rotation of the head causes rotation of the threaded end.

In another embodiment, there is provided a printed circuit board having a row of electrically conductive pads. The row of electrically conductive pads includes: pairs of signal pads with exactly one reference pad interposed between each pair of the signal pads. At least one of the signal pads may have a pad area smaller than an adjacent reference pad. In some embodiments, for at least one pair of the signal pads, each signal pad of the at least one pair has a pad length that is shorter than a pad length of an adjacent reference pad. In some embodiments, for at least one pair of the signal pads, each signal pad of the at least one pair has a pad width that is smaller than a pad width of an adjacent reference pad. In some embodiments, for at least one pair of the signal pads, each signal pad of the at least one pair has a notch at a leading edge of the signal pad.

In another embodiment, there is provided a bracket including a base and a saddle extending from the base. The saddle defines a channel to receive a shank. In some embodiments, the saddle includes an inset surface forming an abutment face in a plane perpendicular to a longitudinal axis of the channel. In some embodiments, the saddle is U-shaped and the inset surface is a U-shaped sidewall.

In some embodiments, there is provided a kit comprising a mechanical retainer as disclosed herein and/or a printed circuit board as disclosed herein and/or a bracket as disclosed herein.

Specific aspects and features will become apparent to those of ordinarily skill in the art upon review of the following description.

BRIEF DESCRIPTION OF THE DRAWINGS

Embodiments will be described, by way of example only, with reference to the accompanying figures wherein:

FIGS. 5A to 5C each illustrate a top view of a connector contact abutted against a circuit board pad, with lateral misalignment shown in FIGS. 5B and 5C;

FIG. 6 illustrates circuit board pads having a chamfered end;

Like reference numerals are used in different figures to denote similar elements.

DETAILED DESCRIPTION

For illustrative purposes, specific example embodiments will now be explained in greater detail below in conjunction with the figures.

The embodiments set forth herein represent information sufficient to practice the claimed subject matter. Upon reading the following description in light of the accompanying figures, those of sufficient skill will understand the concepts of the claimed subject matter and will recognize applications of these concepts not particularly addressed herein. It should be understood that these concepts and applications fall within the scope of the disclosure and the accompanying claims.

Figure 1:
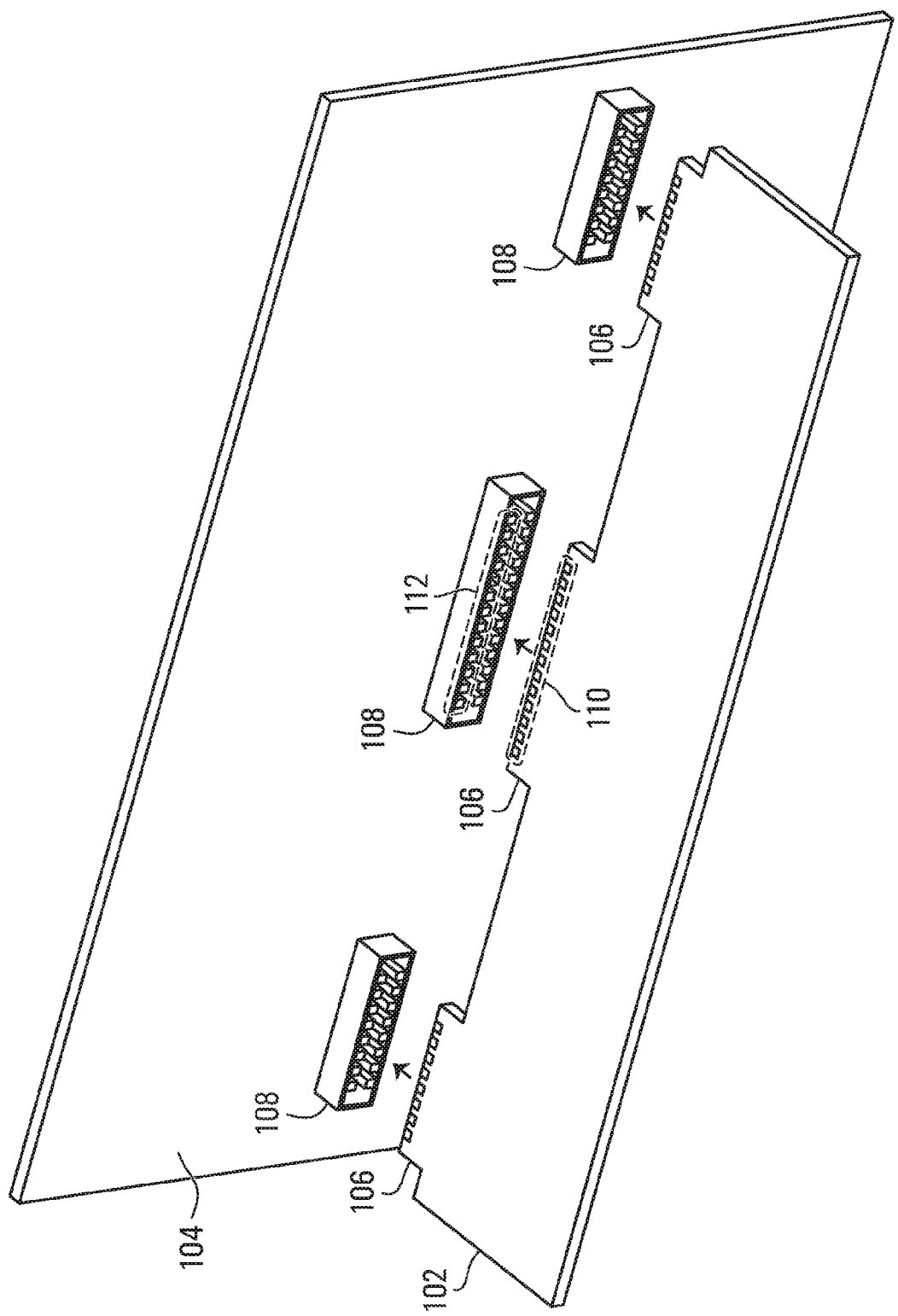
FIG. 1 illustrates a first printed circuit board (PCB) just prior to being mated with a second PCB.

FIG. 1 illustrates a first printed circuit board (PCB) 102 just prior to being mated with a second PCB 104. The second PCB 104 is illustrated as being perpendicular to the first PCB 102. For example, the second PCB 104 may be a backplane or midplane deeper inside an electronics enclosure to which the first PCB 102 is mated. However, more generally, the second PCB 104 does not need to be perpendicular to the first PCB 102. For example, the second PCB 104 could instead be parallel to the first PCB 102.

The first PCB 102 includes three projecting tongues 106, each of which are to be received or "seated" in a respective connector 108. Each connector 108 is mechanically and electrically connected to the second PCB 104. Each tongue 106 includes a plurality of electrically conductive contact pads that are to physically abut against corresponding electrically conductive connector contacts in respective connector 108 when a tongue 106 is seated in a connector 108. For example, pads 110 physically abut against corresponding connector contacts 112 when the middle tongue 106 is inserted into its respective connector 108. The tongue pads and connector contacts will be discussed in more detail below and illustrated in more detail in later figures. The purpose of the pads on each tongue 106 and corresponding contacts on each connector 108 is to electrically connect signals between the first PCB 102 and the second PCB 104 when the pads and connector contacts physically abut against each other.

The details of the connectors 108 and how they connect to the second PCB 104 have been omitted for the sake of clarity in FIG. 1. Similarly, the other details of the first PCB 102 and the second PCB 104 (e.g. signal traces, components, etc.) have also been omitted for the sake of clarity.

When designing an interconnection between two PCBs (or "circuit boards"), it is desirable to have an interconnection that aims to address a mechanical design target of good or acceptable mechanical integrity of the interconnect, as well as an electrical design target of good or acceptable signal integrity. For an interconnection that mates a first PCB to a second PCB that is perpendicular to the first PCB, the electrical signal integrity may be considered a 3-dimensional problem, as compared to most intra-card signal routing, which may be modeled in a simpler 2-dimensional manner, since in most intra-card signal routing signals are generally routed in a co-planar manner. Therefore, when designing an interconnection between two circuit boards, greater attention may be given to the layout of signals and interconnects, particularly due to the increasing speed of signals. Also, to allow for physical tolerances within the system, contacts within the connector and corresponding pads on the circuit board may be oversized to allow for some misalignment when the connector and circuit board are mated. This misalignment may be axial or lateral.

Figure 2:
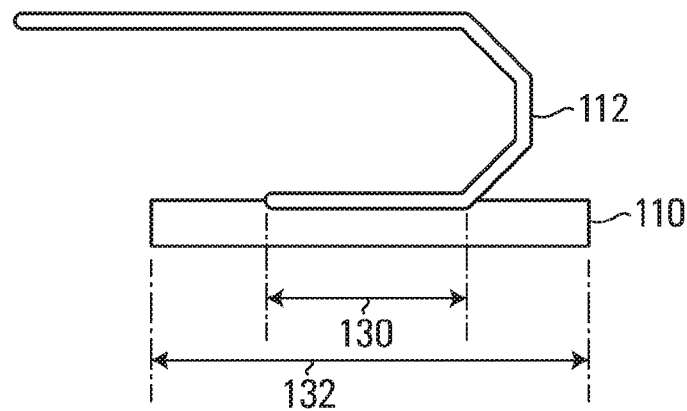
FIG. 2 illustrates a circuit board pad abutted against a connector contact when the circuit board is inserted into the connector.

Axial misalignment occurs when the circuit board tongue does not fully seat within the connector, or during manufacture there is an error in the length of the circuit board pad and/or tongue or an error in the position of the circuit board pad and/or tongue. To help accommodate axial misalignment, pads of increased length may be used. For example, FIG. 2 illustrates a circuit board pad 110 abutted against a connector contact 112 when the circuit board is inserted into the connector. When the circuit board tongue is properly seated in the connector and the pad is in its proper place (as illustrated), the actual contact area 130 between the pad 110 and the connector contact 112 is smaller than the full axial length 132 of the pad 110. However, the extra length of the pad 110 accommodates some axial misalignment, e.g., if the circuit board tongue is not fully inserted (seated) in the connector.

Figure 3:
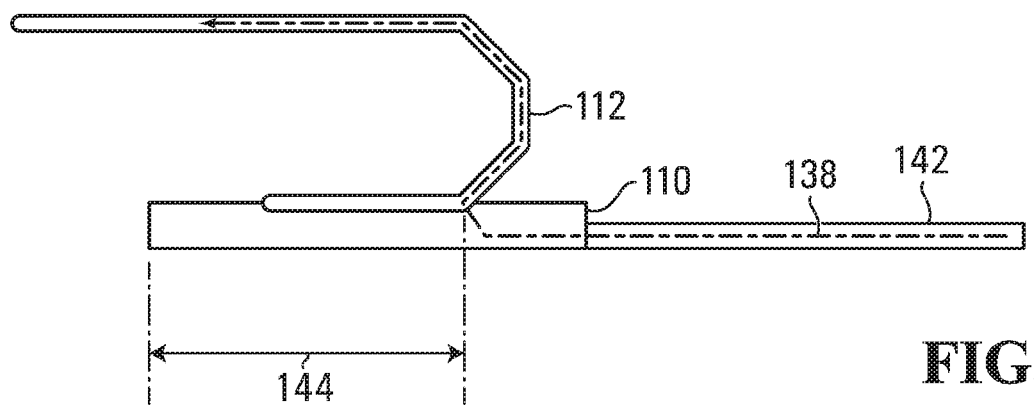
FIG. 3 illustrates the path of an electrical signal through the pad and connector contact of FIG. 2.
Figure 4:
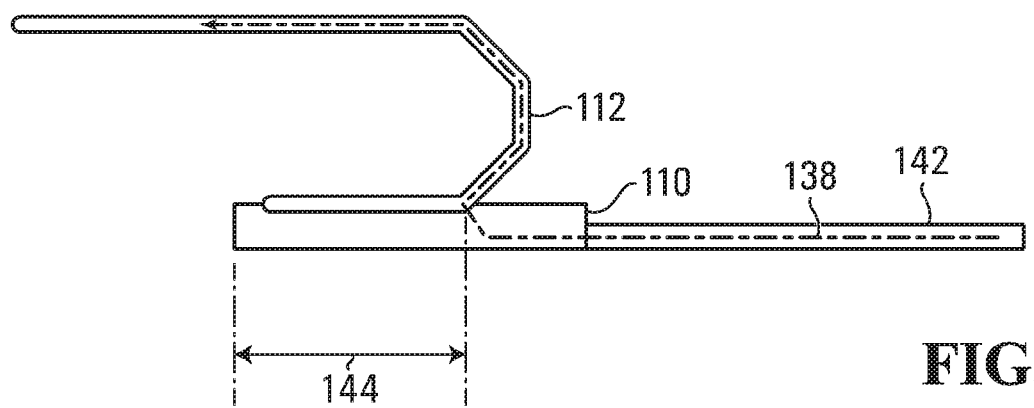
FIG. 4 illustrates the FIG. 3 example modified to have a pad that is shortened.

The increased length of the pad 110 may help accommodate axial misalignment, but it has a drawback in that it may negatively impact the density and/or the electrical fidelity of the carried signals. FIG. 3 illustrates the path of an electrical signal through the pad 110 and connector contact 112 in the FIG. 2 example. Specifically, the signal path is shown via arrow 138. The signal emerges from a circuit board trace 142, travels through the pad 110, and into the connector contact 112. However, the signal follows the shortest, most direct path. This means that the point of contact which is closest to the signal source will be the point at which the current will flow between the circuit board pad 110 and the connector contact 112. Any additional pad beyond that point creates what is known as a "stub", shown at 144, which may cause signal reflections and reduce the quality of the transmission line. In order to reduce the stub, the pad 110 may be shortened. FIG. 4 illustrates the FIG. 3 example modified to have a pad 110 that is shortened. The stub 144 is therefore also shortened. However, this reduces the axial tolerance of the interconnect.

Note that the direction of the signal path 138 in FIGS. 3 and 4 is just an example. The same stub problem would occur, and the same remarks apply, if the signal path 138 was the opposite direction (i.e. a signal emerging from the connector contact 112, travelling through the pad 110, and into the circuit board trace 142).

Lateral misalignment occurs when the connector contacts and the circuit board pads become misaligned laterally. This may occur as a result of tolerance errors in the position of the circuit board pads and the physical edge of the card tongue, or due to a lateral shift in the circuit board within the connector. A connector may allow a certain amount of tolerance in order to ease card insertion and allow for blind mating. To compensate for potential lateral misalignment, the circuit board pads may be widened to try to ensure adequate contact between the connector contact and the circuit board pad.

FIG. 5A illustrates a top view of a connector contact 112 abutted against a circuit board pad 110. Pad 110 is wider than connector contact 112. In FIG. 5A there is no lateral misalignment. However, lateral misalignment from this ideal position can be accommodated. In particular, a mechanical (and therefore electrical) connection between the pad 110 and the connector contact 112 can still be made within a lateral tolerance on either side of the connector contact 112. For example, FIG. 5B illustrates an alternative operable lateral position for the connector contact 112 (relative to the pad 110). Lateral misalignment from the ideal position is accommodated by as much as arrow 152 in the one direction. FIG. 5C illustrates another alternative operable lateral position for the connector contact 112 (relative to the pad 110). Lateral misalignment from the ideal position is accommodated by as much as arrow 154 in the other direction.

Lateral misalignment may also result from the construction of the connector contacts 112 and/or the pads 110. In particular, card-edge connectors may employ a spring-beam construction for the connector contacts in which the connector contacts may be cantilevered from the base of the connector, allowing the point of connection between the pad and connector contact to be more easily pulled laterally off-center. This may be exacerbated if the edges of the circuit board pads are chamfered at the ends, creating a "picket-fence" appearance. FIG. 6 illustrates circuit board pads 110, each having a chamfered end 156. The chamfered leading edge of circuit board pads may push the connector contact off-center laterally, thereby creating the potential for greater lateral misalignment.

Circuit board pads may be made wider in order to compensate for lateral misalignment, but this has a drawback in that it may lead to higher crosstalk and increased trace capacitance. Crosstalk between signals may then be reduced by increasing the space between active signals or active signal differential pairs. However, in order to create adequate spacing between active signals or signal differential pairs, it may be necessary to utilize two or more unused power or ground connector pins between signal pins. This reduces the number of active signals which may be carried within the connector.

The axial and lateral tolerances may be generous to allow for a certain amount of play in the seating of the board. For example, connectors may be specified to function even if the circuit board is not fully seated in the connector, or is pulled laterally to one extreme or the other. Furthermore, if there is angular misalignment of the circuit board, some connectors may be fully seated while others are not.

In view of the above, to accommodate axial and lateral misalignment, inter-board connectors may use signal trace size and inter-trace spacing that is larger than can be achieved when routing such signals on a planar circuit board. Also, when signals are routed on a planar circuit board, impedance may be more effectively controlled due to reference planes of tight tolerance within the board. These reference planes may not be carried through inter-board connectors in the same controlled manner, and so additional contacts may be allocated within the connector to try to provide signal isolation and tightly-coupled current return paths for the signals through both the interconnected circuit boards and the connector. These additional reference connector contacts result in connectors of a larger physical size, further expanding the space used to carry signal traces from one board to another.

Additionally, to help mitigate the type of misalignment discussed above and help keep the circuit board tongues fully seated in the connector, one or more mechanical retainers may be used to retain the circuit board in the desired position when the tongues are inserted into the connector. Such mechanical retainers may include levers, screws, or latches.

If the circuit board that is to be connected to the connector(s) is removable by a user, then such mechanical retainers are often located on the trailing edge of the circuit board, i.e., the edge of the circuit board that is opposite the leading edge at which the tongues and pads are located. This is so that the mechanical retainers are more convenient for access by the user.

A problem with some mechanical retainers, such as levers or ejectors, is that they may consume a significant amount of space on the trailing edge of the circuit board. This is undesirable, particularly in systems where space is also needed on the trailing edge to accommodate input/output connectors, controls, and/or indicators. Also, such retention mechanisms placed at the trailing edge of the board may suffer from an accumulation of mechanical tolerances, such that they may not be able to reliably seat all connectors at the leading edge of the board. For example, these retainers may be mounted on a faceplate which is coupled to the trailing edge of the circuit board. In such a situation, both the faceplate and the coupling mechanism are subject to additional tolerances.

Another problem is that as the number of interconnects between the board and backplane increase, the insertion and extraction forces increase. Manual insertion and extraction of circuit boards may eventually become impractical due to the forces required. If ejectors or levers are used, larger levers may be required to provide adequate leverage to insert and extract the board, further reducing the space on the trailing edge of the board. Levers may also be subject to movement after insertion due to tolerances, stresses, and vibration, which may lead to movement of the installed circuit board from the fully-seated position. Alternatively, if screw-type retainers are used on the sides of the trailing edge of the board (e.g. to thread into the chassis near or at the trailing edge), these retainers may lead to angular misalignment, as only one side at a time is practical to tighten. This may further cause user frustration if the angular misalignment is severe enough that the circuit board binds on the card guides, preventing proper insertion.

An Alternative Mechanical Retainer

Figure 7:
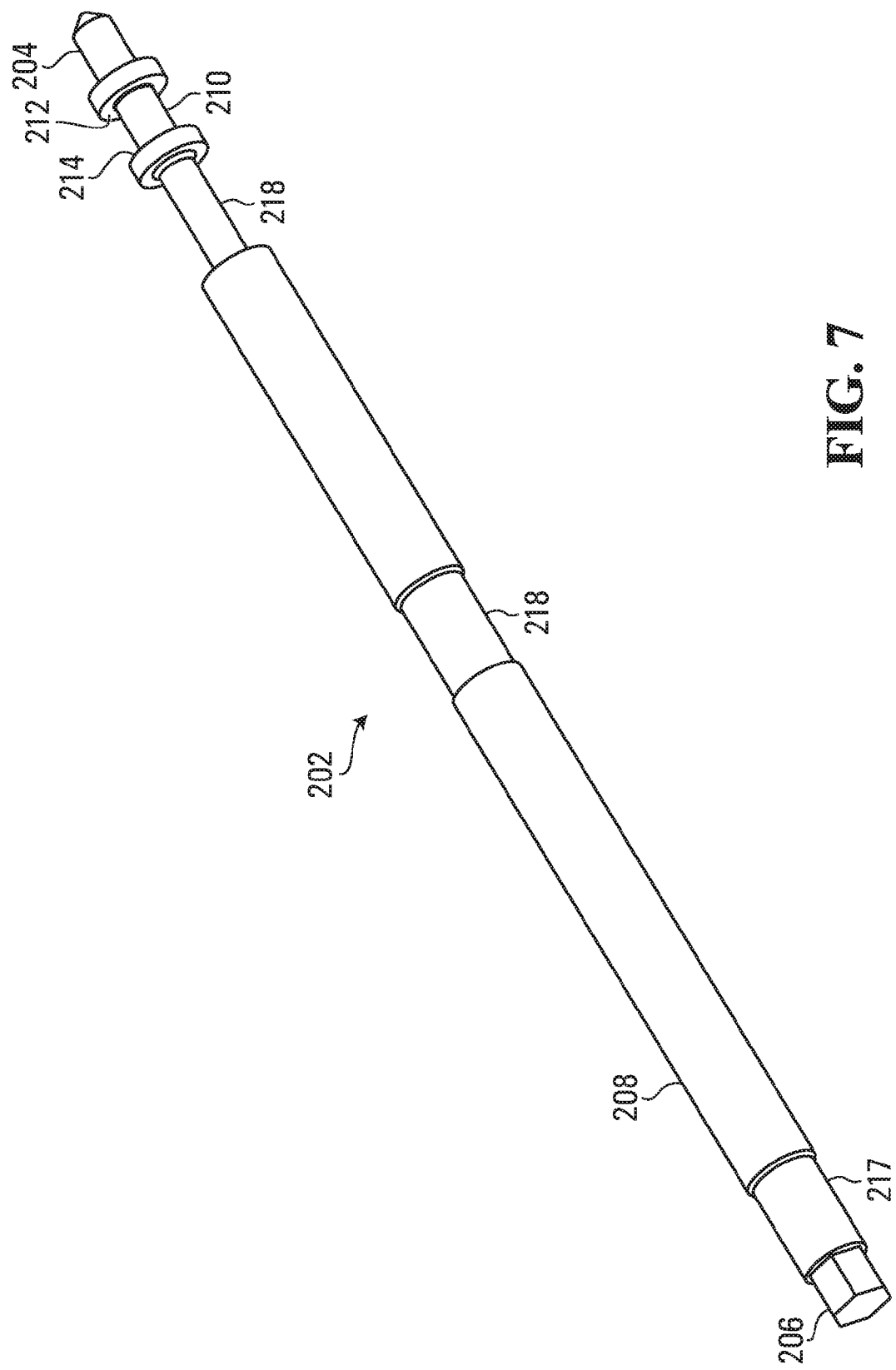
FIG. 7 illustrates one embodiment of a mechanical retainer.
Figure 8:
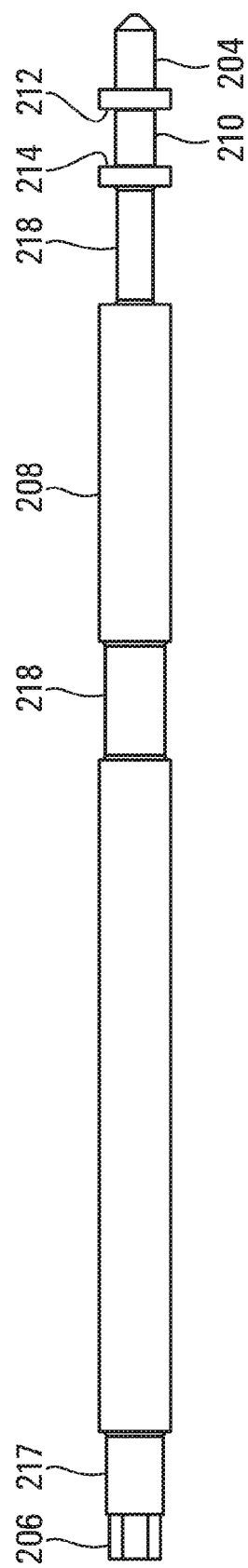
FIG. 8 is a side view of the FIG. 7 embodiment.

FIG. 7 illustrates one embodiment of a mechanical retainer 202 for assisting in connecting a circuit board to one or more connectors and for retaining the circuit board in the connector(s). FIG. 7 is an isometric view. FIG. 8 is a side view of the FIG. 7 embodiment. With reference to FIGS. 7 and 8, the retainer 202 comprises a longitudinal body having a threaded end 204, a head 206 at the opposite end, and a shank 208 connecting the head 206 to the threaded end 204. Rotation of the head 206 causes rotation of the shank 208, which causes the threaded end 204 to rotate. The retainer 202 may be considered a "screw retainer" in that, as explained below, the threaded end 204 screws into a corresponding hole on a backplane or midplane.

The exact structure of the head 206 is implementation specific. For example, it may be shaped to be captured by a tool, such as a screwdriver, a hex key or a nut driver. The shape of the head 206 end may be a standard slot to receive a flat-blade screwdriver, grooves to receive a Philips screwdriver, a square notch to receive a Robertson screwdriver, or the head 206 end may be a hex or other shape. In the illustrated embodiment the head 206 is a hex shape. Alternatively, the head 206 may be shaped and sized to facilitate rotation by hand. For example, the head 206 may comprise a handle or thumb screw.

Adjacent the threaded end 204 of the mechanical retainer 202 is an annular groove 210 defined between two axially spaced and radially extending abutment surfaces 212 and 214. Abutment surface 212 is closer to the threaded end 204, and opposite abutment surface 214 is farther from the threaded end 204. The annular groove 210 is to be received in a saddle of a bracket, with the abutment surfaces 212 and 214 used to facilitate insertion and removal of a card from a backplane or midplane, in the manner explained below. It will be appreciated that the abutment surfaces 212 and 214 do not need to be separate pieces or plates, but could just be the edges of the annular groove 210 itself, which would be created when the groove 210 is formed, i.e. the edges created when the radius of the shank 208 is reduced to form the annual groove 210. Alternatively, there does not have to be an annular groove 210, but instead just the two axially spaced and radially extending abutment surfaces 212 and 214.

Adjacent the head 206 is another annular groove 217 which, as explained below, is to be received in an aperture of a cover plate.

The shank 208 also includes some other annular grooves 218, which are to help clear components on the circuit board, as explained below. These grooves 218 may or may not be present, and if they are present their location is implementation specific. The presence and location of the other grooves 218 is dependent upon where specific components are located on the circuit board.

Figure 9:
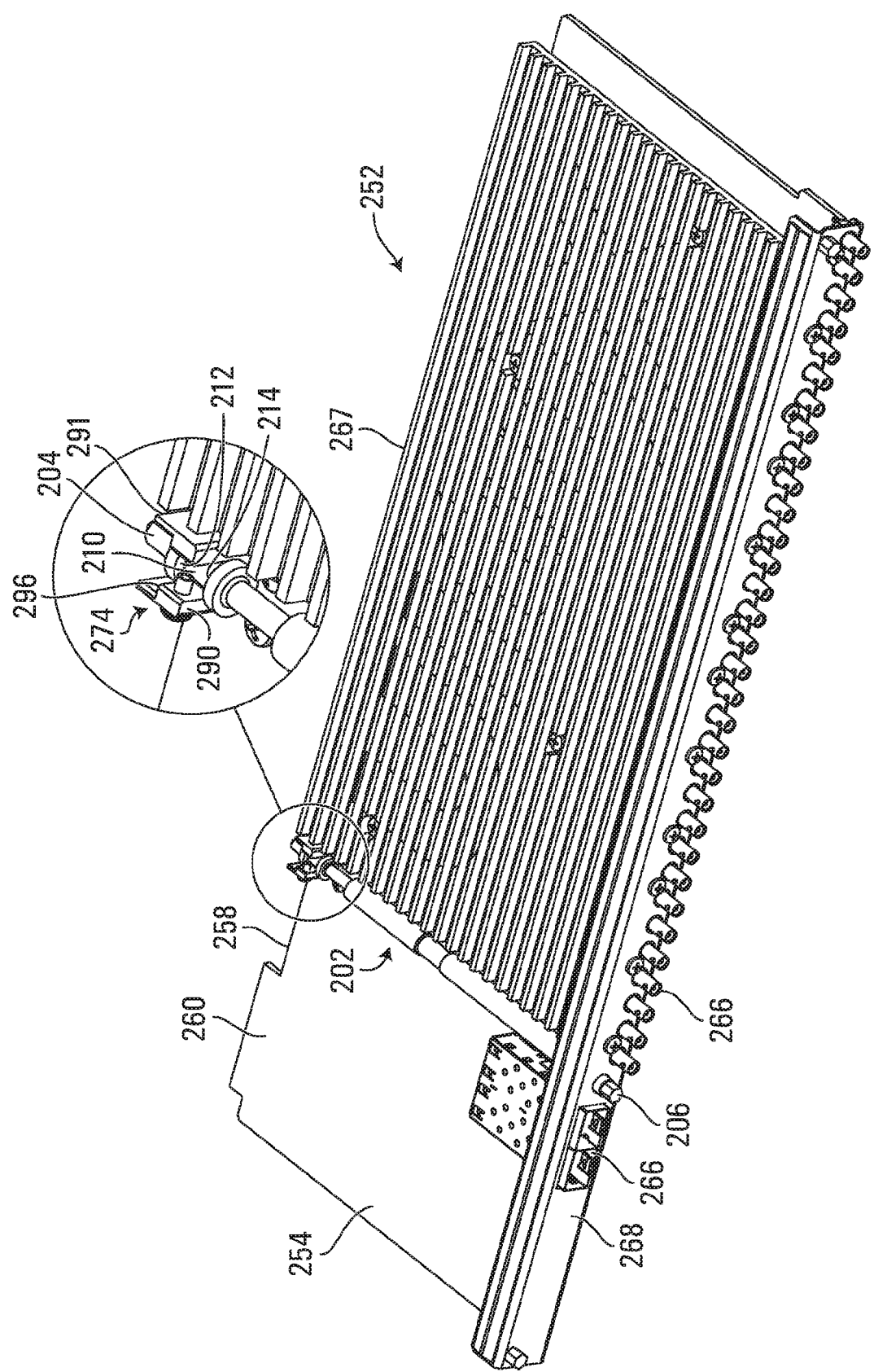
FIG. 9 illustrates an example of a card that utilizes the mechanical retainer of FIGS. 7 and 8.
Figure 10:
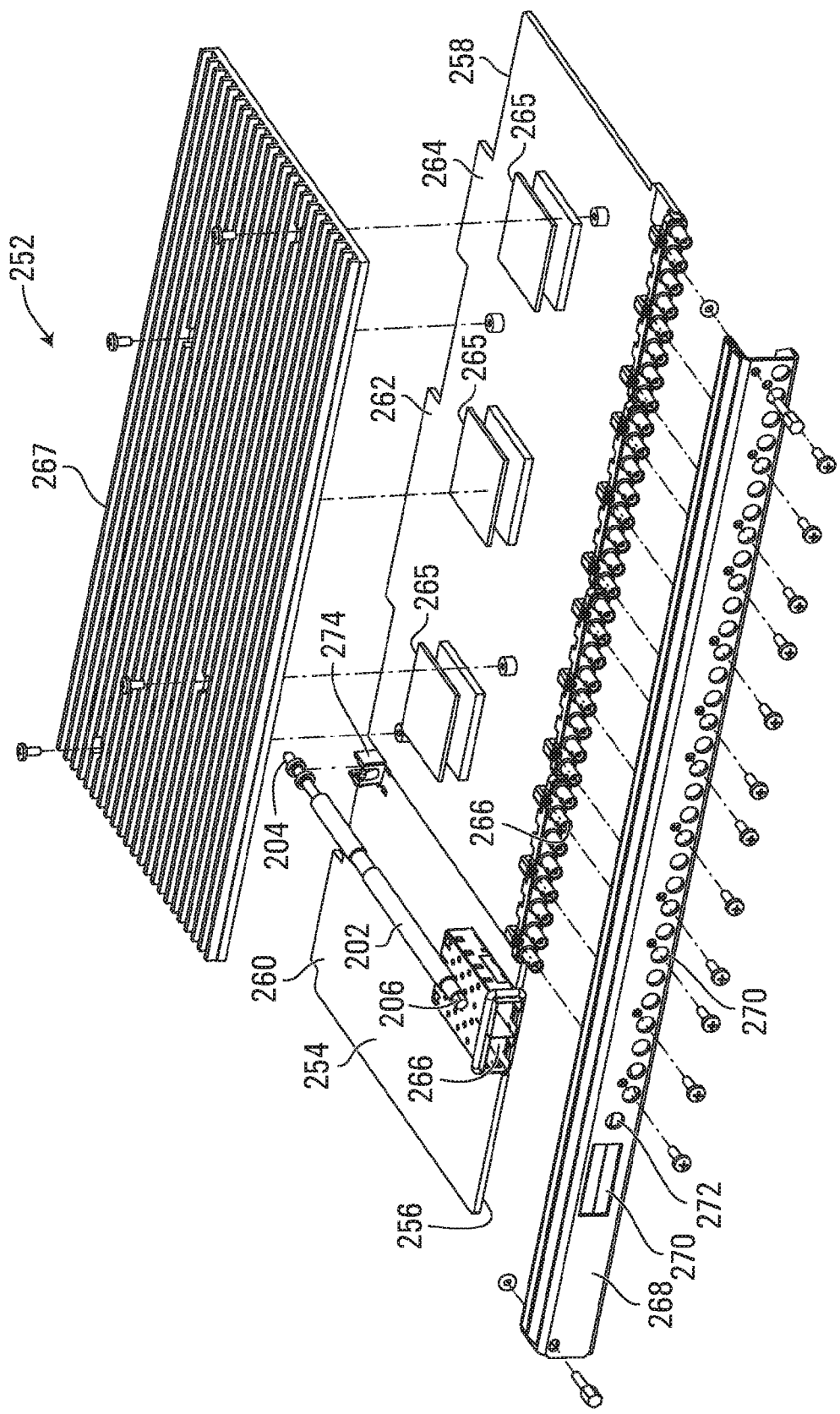
FIG. 10 illustrates a partially exploded view of the card of FIG. 9.

The retainer 202 may be made of steel and manufactured by turning the steel on a lathe. Alternatively, the retainer 202 may be made from aluminum and formed through other means. The retainer 202 may be made of other materials instead. However, a possible benefit of steel is that it may provide superior strength for the head 206 (where it mates with a tool or is turned by a hand), and for the threaded end 204 (where it meets a threaded receptacle in a backplane or midplane), and it may be less likely to wear. FIG. 9 illustrates an example of a card 252 that utilizes the mechanical retainer 202. FIG. 10 illustrates a partially exploded view of the card 252 of FIG. 9. With reference to both these figures, and particularly FIG. 10, the card 252 comprises a circuit board 254 having a trailing edge 256 and an opposite leading edge 258. The leading edge 258 has three tongues 260, 262, and 264, and the trailing edge 256 has several input/output connectors or ports, such as those indicated at 266. The three tongues 260, 262, and 264 each have electrically conductive pads (not illustrated) for being received in a corresponding connector (also not illustrated). The pads and connectors have been omitted from FIGS. 9 and 10 for clarity and to emphasize that any acceptable pad layout may be used. Circuit components that may be mounted on the circuit board 254 have also been omitted for the sake of clarity, except that integrated circuit chips 265 are illustrated in FIG. 10 for the sake of example.

The card 252 further includes the mechanical retainer 202, which runs the full depth of the circuit board 254 (i.e. from the trailing edge to the leading edge), with the retainer head 206 at the trailing edge 256 and the retainer threaded end 204 at the leading edge 258. The card 252 further includes a heat sink 267, as well as a front cover plate 268. The heat sink 267 helps dissipate heat, while the front cover plate 268 helps protect and enclose the circuit board 254. However, the cover plate 268 does include a plurality of apertures, such as apertures 270, for exposing the input/output connectors and ports 266. A further aperture 272 in the cover plate 268 is also present to receive and expose the head 206 of the mechanical retainer 202. The rim of the aperture 272 also supports the mechanical retainer 202. The other end of the mechanical retainer 202, adjacent the threaded end 204, is supported at the leading edge 258 of the circuit board 254 by a bracket 274. The bracket 274 and the rim of the aperture 272 support the mechanical retainer 202 above the circuit board 254 so that the mechanical retainer 202 does not grate against the circuit board 254 when being rotated.

Figure 11:
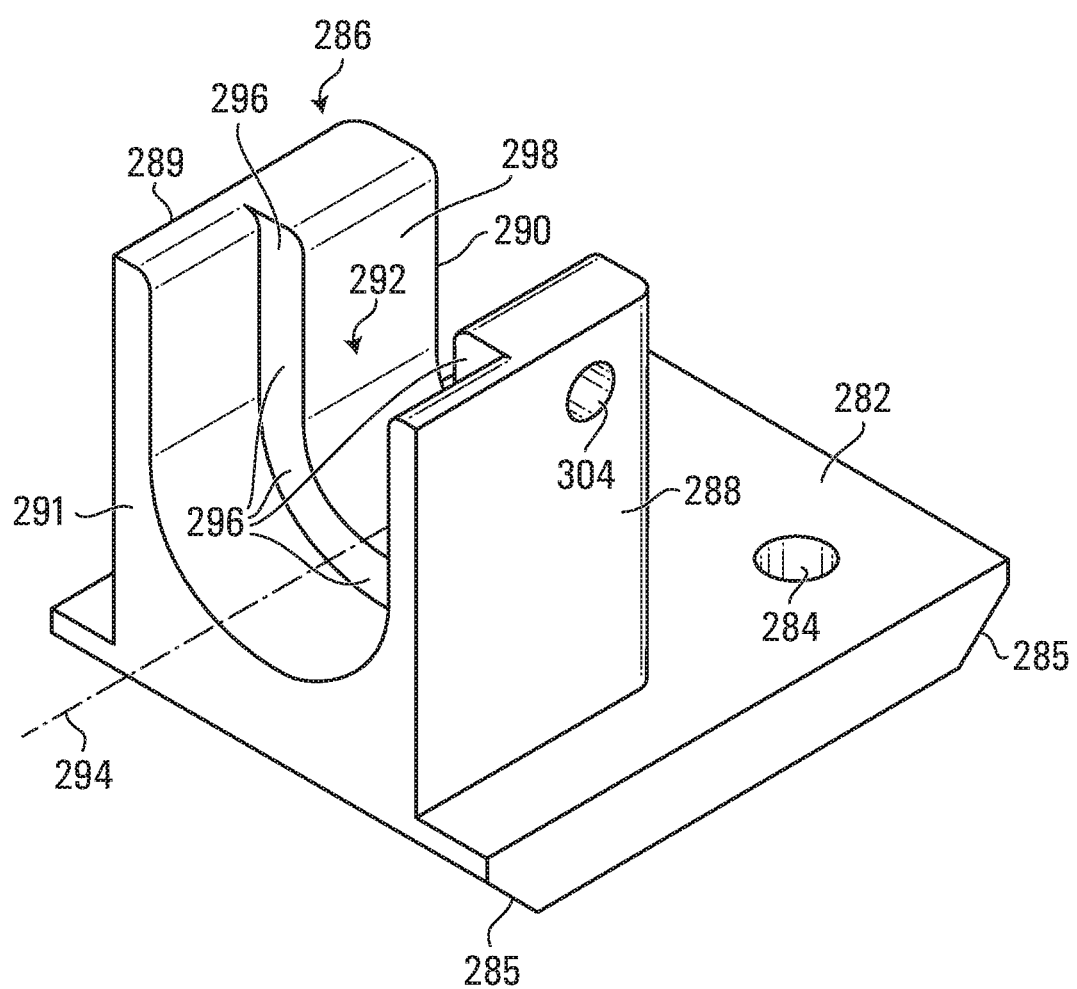
FIG. 11 illustrates in more detail the bracket in FIGS. 9 and 10.
Figure 12A:
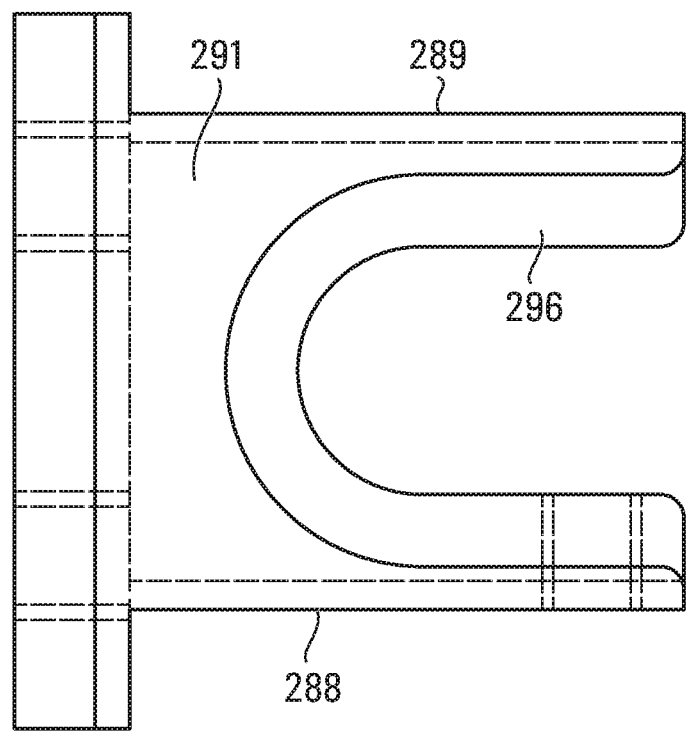
FIG. 12, consisting of FIGS. 12A, 12B, and 12C, is an illustration showing the front, top, and side views of the bracket of FIG. 11.
Figure 12B:
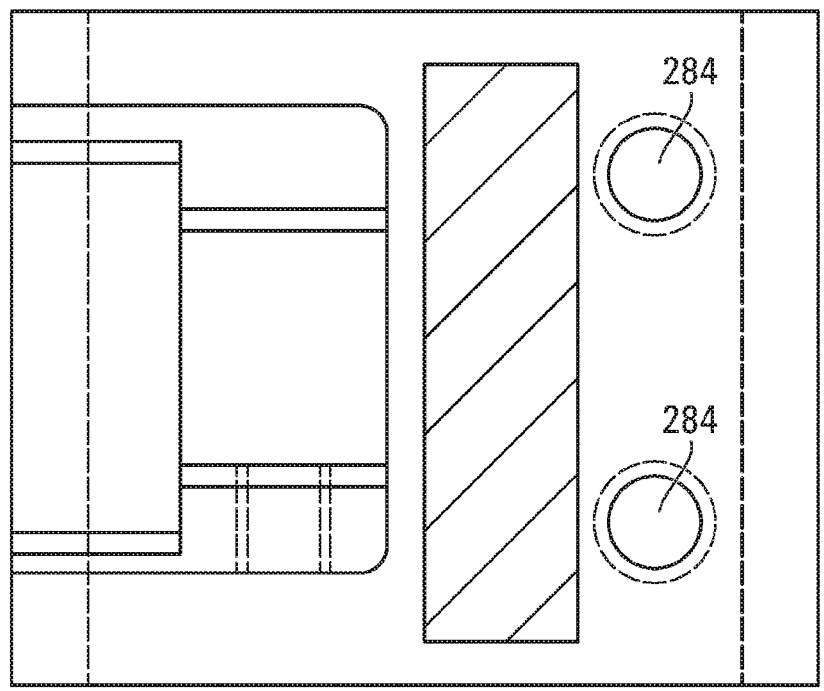
Figure 12C:
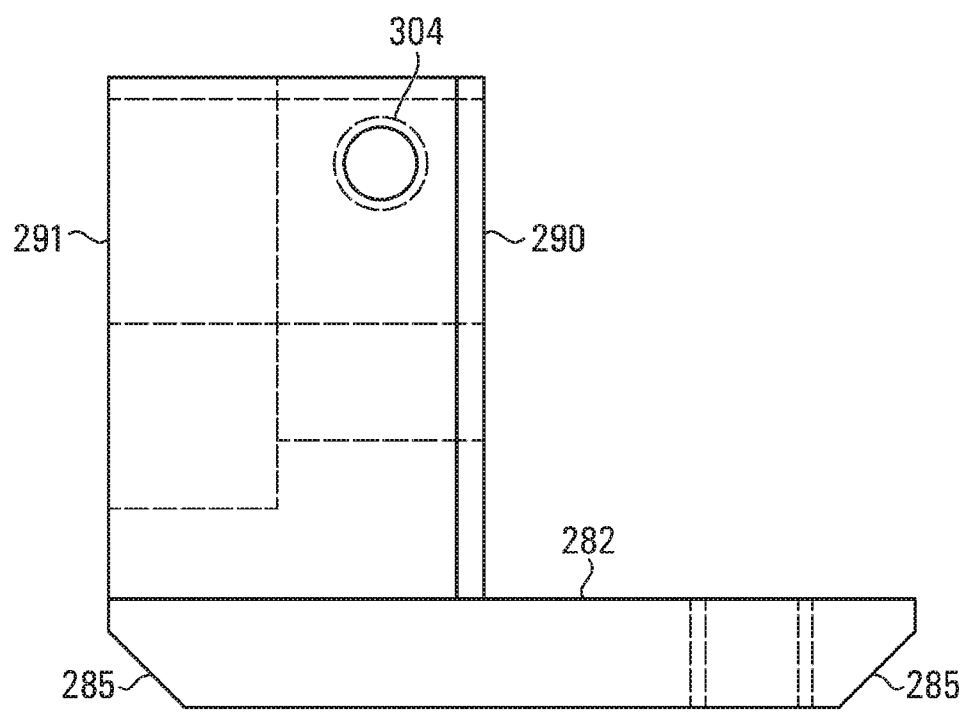

The bracket 274 is illustrated in more detail in FIG. 11. FIG. 11 is an isometric view. FIG. 12 is an illustration showing the front (FIG. 12A), top (FIG. 12B), and side (FIG. 12C) views of the bracket 274. With reference to FIGS. 11 and 12, the bracket 274 includes a base 282 having apertures 284 for receiving a fastener (not shown), such as screws, for mounting the base 282 to the circuit board 254. A saddle 286 extends from the base 282 and is to receive the mechanical retainer 202 in a channel 292. The base 282 is designed to be mounted to the underside of the circuit board 254, with the saddle 286 projecting upwards through a hole in the circuit board 254. Since the base 282 is designed to be mounted to the underside of the circuit board 254, the base 282 therefore has chamfered edges 285 to possibly help guide the board 254 over a cover plate of another circuit board (not shown) in a slot below when the board 254 is inserted or extracted from a chassis.

In the illustrated embodiment, the saddle 286 is specifically U-shaped in cross-section and is defined by opposite rectangular side walls 288 and 289 extending perpendicular to the base 282 and opposite U-shaped faces 290 and 291. The "U" defines the channel 292 to seat the mechanical retainer 202. Although the U-shaped channel is illustrated as a traditional "U" (i.e. opposite upstanding sides that each curve inward at their bottom and meet each other at the lowest point of the "U"), it could instead be a three-sided box (i.e. opposite upstanding sides and a base that is substantially perpendicular to the sides), although this may be less optimal since such a shape may not as easily accommodate rotation of the retainer 202. "U-shaped" is intended to encompass such variations. Alternatively, the channel 292 may not be U-shaped at all, but instead be a half circle, inverted triangle, or some other channel structure. However, a semi-circular shape may be more optimal in terms of more easily accommodating rotation of the retainer 202. In any case, the channel 292 may be considered to have a longitudinal axis 294, which would line up with a longitudinal axis of the mechanical retainer 202 when the mechanical retainer 202 is seated in the channel 292.

The saddle 286 has an inset wall or surface 296 that is axially inset from face 291 and is in a plane perpendicular to the longitudinal axis 294 of the channel 292. In the illustrated embodiment, the surface 296 is an inset U-shaped wall integrally formed with the saddle, but more generally this need not be the case. For example, the wall forming the surface 296 need not be U-shaped. Also, although not illustrated, it is contemplated more generally that the surface 296 could instead be provided by an inset peg or another abutment surface that provides an inset surface 296.

An aperture 304 near the top of the U-shaped saddle 286 is present and faces in a direction substantially perpendicular to the longitudinal axis 294 of the channel 292. The aperture 304 is to receive either a screw, a bolt, a peg, or equivalent (not illustrated) that, when inserted into the aperture 304 extends across the "U" substantially perpendicular to the longitudinal axis 294 of the channel 292. When in this position, the screw, bolt, or peg further helps to retain the mechanical retainer 202 in the channel by preventing the mechanical retainer from being lifted out of the channel.

The bracket 274 may be made of aluminum, plastic, steel, or other materials, and may be fabricated through casting or other methods.

Operation will now be explained with reference to FIG. 9. When the circuit board 254 of the card 252 is to be inserted into the connectors (not shown), the card 252 may be placed in a card guide in a chassis (also not shown), which generally lines up the card 252 with the connectors. Then, a user rotates the head 206 of the mechanical retainer 202 clockwise, which causes the threads on the threaded end 204 of the retainer 202 to be captured by a threaded hole in the backplane or midplane (also not shown). This draws the retainer 202 forward, that is, in the direction of the leading edge 258 of the circuit board 254 towards the connectors. The abutment surface 214 of the retainer 202 begins to abut against the U-shaped sidewall 290 of the bracket 274. The force against sidewall 290 of the bracket 274 applied by the mechanical retainer 202 causes the whole card 252 to advance until the circuit board tongues reach "the bottom" of the connectors, i.e., the leading edge 258 of the tongues of the circuit board 254 abuts against the back or "bottom" of the connectors, such that it cannot advance any more, indicating that the tongues of the circuit board 254 are fully seated in the connectors. The card 252 is therefore secured in the connectors and fully seated. The retainer 202 remains captive in the threaded hole in the backplane or midplane, and thus abutment surface 214 continues to apply positive force upon the bracket 274, which transfers the force through the circuit board 254, thereby holding the tongues in the fully seated position of the mating connectors. To remove the card 252, the head 206 of the retainer 202 is rotated counter-clockwise. The threads of the threaded end 204 therefore withdraw from the backplane or midplane, and then the abutment surface 212 of the retainer 202 begins to abut against the inset surface 296 of the bracket 274. The force against the surface 296 of the bracket 274 applied by the mechanical retainer 202 causes the whole card 252 to advance away from the connectors until the card 252 is disconnected.

It will be appreciated that in the illustrated embodiment, the length of the annular groove 210 is slightly longer than the axial length of the channel 292 of the bracket 274 so that the retainer 202 may slide axially along the board in order to ease insertion and removal of the circuit board 252. Also, the annular groove 210 does not need to be adjacent to the threaded end 204 of the retainer, but could be moved farther up the shank 208 away from the threaded end 204. In this case, the bracket 274 would also be offset inwards away from the leading edge 258 of the circuit board 254. However, having the annular groove 210 adjacent the threaded end 204, and therefore the bracket 274 adjacent the leading edge 258 of the circuit board 254, as illustrated, may better align the threaded end 204 with the hole in the backplane/ midplane.

Note that the inset surface 296 is not a necessary design feature. The bracket 274 could instead be designed such that the abutment surface 212 of the retainer 202 abuts and pushes against the sidewall 291 of the bracket 274 when the retainer 202 is being unscrewed from the backplane. However, having the inset surface 296 inset away from the leading edge 258 of the circuit board 254 allows the threads of the threaded end 206 of the retainer 202 to be drawn out, at least partially, before the abutment surface 212 of the retainer 202 begins to abut against the bracket 274. This may allow for easier removal of the card 252 from the connectors, as the user rotating the head 206 of the retainer 202 counter-clockwise does not have to overcome both the friction of the threads and the extraction force at the same time. If the surface 296 was instead not inset, but flush with sidewall 291 (or surface 296 did not exist and just sidewall 291 was used), then a user would need to exert a torque using the head of the retainer 202 that was large enough to simultaneously: (i) overcome the friction of the threads in the backplane/midplane hole, and (ii) push the bracket 274 to move the card 252 out of the connectors. Having the inset surface 296 separates these two tasks (or at least partially separates these two tasks, depending upon the amount by which the surface 296 is inset). Also, it will be appreciated that an annular groove 210 does not need to be present, just axially spaced radially extending sidewalls (one to go on each side of the bracket). Additionally, it will be appreciated that the specific shape of the bracket can be varied.

With reference to FIG. 10, in the illustrated embodiment, the retainer 202 is located between tongues 260 and 262 on the circuit board 252. The retainer 202 could instead be located between tongues 262 and 264. In any case, having the retainer 202 interposed between two tongues means that the force applied by the retainer 202 may draw the circuit board 252 into the connectors with less angular misalignment compared to having the retainer 202 positioned at one side of the board 252, or compared to two screw retainers, one on each side of the card and alternatively tightening each one. In this way, selection of a location of the retainer 202 may provide a more consistent pressure into all connectors and aid in fully seating those connectors. Furthermore, the retainer 202 may provide significantly higher insertion force at a point closer to the connectors, to overcome the high insertion resistance of high pin-count connectors.

In the illustrated embodiment the shank 208 of the mechanical retainer 202 is illustrated as a cylinder, that is, the cross-section of the shank 208 is a circle. It will be appreciated that the shank 202 could instead have another shape, such as a cross-section that is the shape of a hexagon, triangle, square, etc. In such a case, any annular grooves in the shank (e.g. 210, 217, 218) may, but need not necessarily, follow the physical geometry of the shape.

In the illustrated embodiment, the bracket 274 is between the faces 212 and 214 of the mechanical retainer 202. Instead, the mirror opposite could also be possible: the bracket could comprise two opposite upstanding members, and the shank of the mechanical retainer could have a radially extending segment interposed between the two opposite upstanding members of the bracket. The radially extending segment of the shank would still have two axially spaced radially extending abutments surfaces: one on each side of the segment.

Finally, although the bracket 274 is illustrated as also supporting the mechanical retainer, in general it does not have to (the mechanical retainer could be supported by some other means).

Circuit Board Pad Layouts

Figure 13:
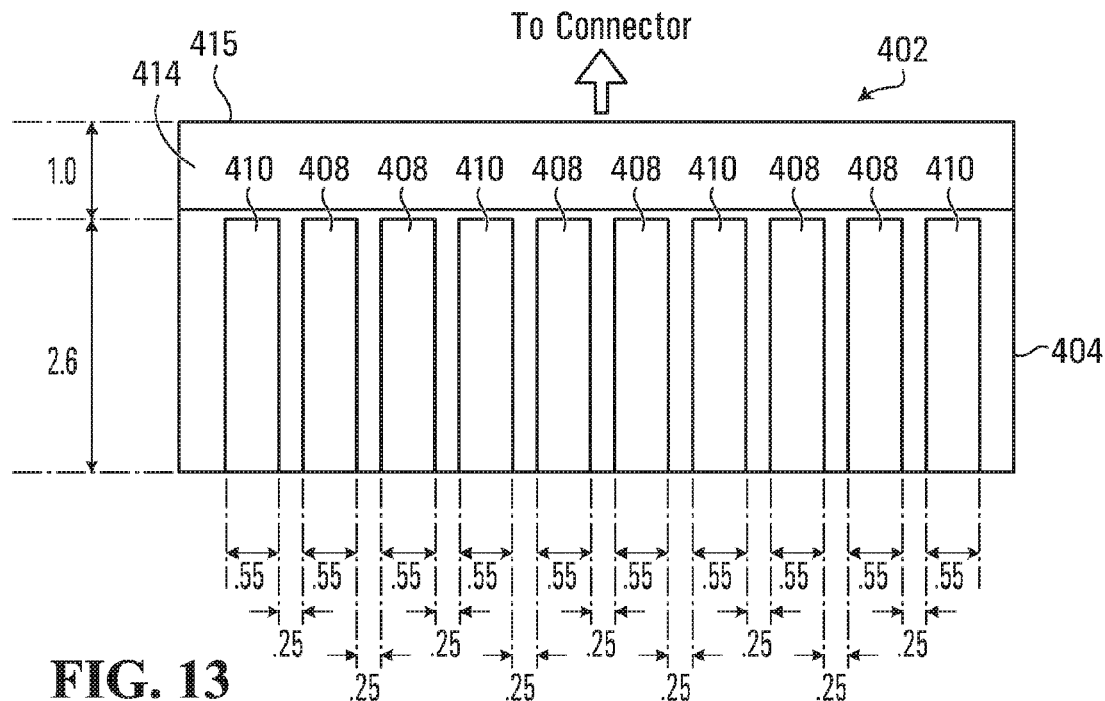
FIG. 13 illustrates an embodiment of a circuit board pad configuration.

FIG. 13 illustrates an embodiment of a circuit board pad configuration 402 that may be used for electrically connecting a circuit board 404 to connector contacts of a connector, such as a card-edge connector. In this example, a single electrically conductive reference pad 410 is interposed between each pair of electrically conductive signal pads 408 in a repeating pattern (i.e. reference pad, signal pair, reference pad, signal pair, reference pad, . . . ). Only a row of ten pads is illustrated in FIG. 13 for simplicity, but in actual implementation the row may be much longer.

The signal pads 408 are called "signal pads" because they each carry a data signal. In particular, the data is carried as a differential pair (one pad of the pair for each signal of the differential data signal). The data may be high speed, e.g., 100 megabits per second or greater, hence why the differential signal and pair of signal pads.

Each reference pad 410 is called a "reference pad" because it does not carry a data signal, but is instead connected to a reference plane (i.e. ground or power).

In FIG. 13 the pads do not go right to the leading edge of the circuit board 404, as the board 404 has a chamfered portion 414 at its leading edge 415.

Measurements are shown in FIG. 13 in millimeters. As can be seen from these measurements, the width of the gap between signal pairs is: 0.25 mm (the distance between signal pad 408 and adjacent reference pad 410) plus 0.55 mm (the width of the reference pad 410) plus 0.25 mm (the distance between reference pad 410 and the beginning of the next signal pad 408), which equals 1.05 mm. Therefore, the ratio of space between signal pairs (1.05 mm) to the width of each signal pad (0.55 mm) is 1.05/0.55, which is less than 2:1. As a matter of good engineering practice, a ratio of 3:1 to 5:1 (or at least closer to 3:1) is preferred. This could be achieved by putting two reference pads between each signal pair, but the size of the connector would then have to be increased by 33% to accommodate the same number of signal pads.

Figure 14:
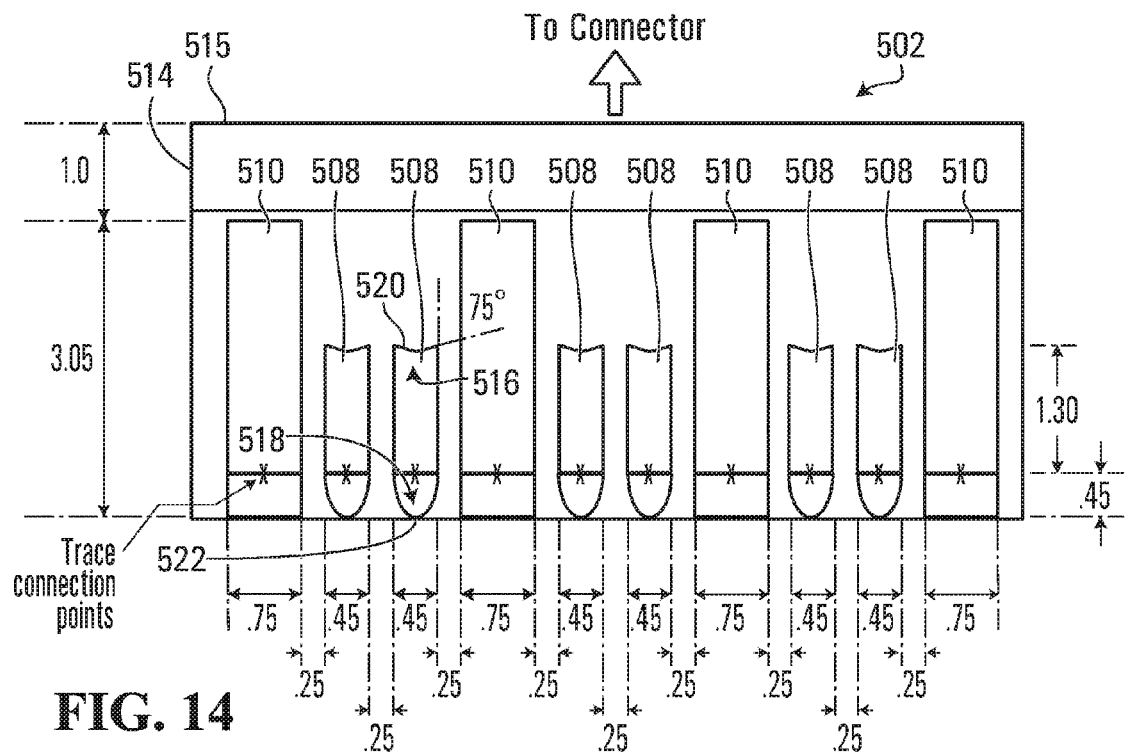
FIG. 14 illustrates another embodiment of a circuit board pad configuration.

FIG. 14 illustrates another embodiment of a circuit board pad configuration 502. In this example, a single electrically conductive reference pad 510 is also interposed between each pair of electrically conductive signal pads 508 in a repeating pattern (i.e. reference pad, signal pair, reference pad, signal pair, reference pad, . . . ). Again, only a row of ten pads is illustrated for simplicity, but in actual implementation the row may be much longer. Each pair of signal pads carries a data signal as a differential pair (one pad of the pair for each signal of the differential data signal). The data is high speed (e.g. around 100 megabits per second or greater, and possibly even greater than 10 gigabits per second).

Each reference pad 510 does not carry a data signal, but instead connects to a reference plane (i.e. ground or power).

In FIG. 14, as in FIG. 13, the pads do not go right to the leading edge of the circuit board, as the board has a chamfered portion 514 at its leading edge 515.

As can be seen from FIG. 14, the area of the signal pads is smaller than the area of the reference pads. Specific measurements are shown in FIG. 14, which are in millimeters. Compared to FIG. 13: (i) the width of the reference pads 510 have been increased by about 35%, which may provide greater isolation from edge-coupled crosstalk; (ii) the width of the signal pads 508 have been decreased, which increases the width of the gap between signal pairs, and (iii) the length of the signal pads 508 have been shortened on the side closest to the leading edge so that the amount of stub is reduced when the board is fully seated in the connector (e.g. as in FIG. 4).

As can be seen from the measurements, the width of the gap between signal pairs is: 0.25 mm (the distance between signal pad 508 and reference pad 510) plus 0.75 mm (the width of reference pad 510) plus 0.25 mm (the distance between reference pad 510 and the beginning of the next signal pad 508), which equals 1.25 mm. Therefore, the ratio of space between signal pairs (1.25 mm) to the width of each signal pad (0.45 mm) is 1.25/0.45=2.7, which is closer to 3:1.

Another design feature of the pad layout 502 of FIG. 14, which is independent of the other features discussed above, is a notch at the leading edge of each of the signal pads. Specifically, each of the signal pads 508 has a leading edge 516 closest to the leading edge 515 of the board, and an opposite trailing edge 518. The leading edge 516 of each signal pad has a notch 520, which acts as a guide to draw the connector contacts towards the center of the pad, thereby possibly reducing the potential for misalignment compared to "picket-fence" style pad end shapes (i.e. compared to the pads of FIG. 6, which may jet to one side of the connector contact causing misalignment due to the "picket-fence" end shape). The notch 520 may be the shape of an inverted triangle or have a scalloped shape, i.e., curved, half circle, hollowed in, etc. The shape as shown in FIG. 14 is a hollowed in notch having sides that extend away from the deepest point of the notch at an angle of 75 degrees. The choice of 75 degrees is implementation specific, but for the present embodiment was found to be a good balance between the competing objectives of: (i) having enough of an angle so that the connector contact guiding function is effectively performed, while (ii) not cutting too much into the center of the pad.

In the illustrated embodiment, the trailing edge 518 of each of the signal pads 508 has a tapered portion 522, which tapers down to the width of the trace to which the pad is connected.

With the features described above, notably the thinner and shorter signal pads, wider reference pads, and the notch 520, superior crosstalk isolation may still be provided despite only one reference pad between each signal pair and despite high speed data signals possibly greater than 10 gigabits per second. Using only one reference pad between each signal pair (instead of two or more) also increases signal density and reduces overall connector size requirements. A reduction in the connector size is desirable as it may reduce cost, circuit board area and overall insertion and extraction forces required when the circuit board is mated or unmated with the connectors. By shortening the length and reducing the width of the signal pads (compared to the FIG. 13 embodiment), stubs may be reduced on the transmission lines while simultaneously reducing trace capacitance and creating greater space between active signals, which in turn may reduce crosstalk. That being said, it will be appreciated that embodiments are also contemplated in which the combination of thinner and shorter signal pads, wider reference pads, and the notch 520 is not implemented. For example, in an alternative embodiment, the notch 520 may be present, but the signal pads not reduced in length (or vice versa), or the signal pads may be reduced in width, but not length (or vice versa), or the signal pads may have a reduced width and length, but not a notch 520 (or vice versa). Embodiments are also contemplated in which there may be more than one reference pad interposed between pairs of signal pads and/or there may only be single signal pad (not pairs), but the signal pads have some or all of the other features described above (e.g. thinner and/or shorter and/or notch).

In the FIG. 14 embodiment, the lengths of the reference pads 510 are not reduced. This is because the problem of the "stub" discussed earlier is not applicable to the reference pads, as such pads do not carry data signals, but instead connect to ground or power. Also, in many designs most of the reference pads would be ground pads (i.e. connected to ground), and to help mitigate any undesirable transient electronic behavior when the pads make mechanical (and therefore electrical) contact with the connector, it is preferable for the ground pads to make electrical contact first. This may be more readily achieved by having the reference pads longer than the signal pads, as then the reference pads begin closer to the leading edge of the circuit board and should mate with the connector first. However, in an alternative embodiment, the length of the reference pads could be reduced, such as to match the length of the signal pads. Also, the reference pads could have the same notch as notch 520 described in relation to the signal pads.

Because the length and width of the signal pads are reduced, there is less tolerance for misalignment between the connector contacts and the circuit board pads. Precise seating of the circuit board in the connectors is desired. Design features such as the notch 520 help achieve this. However, in one embodiment the circuit pad layout of FIG. 14 is advantageously used in combination with a mechanical retainer such as the mechanical retainer 202 described earlier, so that the securing ability of the mechanical retainer can be relied upon to ensure misalignment is mitigated by an amount sufficient to ensure satisfactory electrical signal integrity of the connection, despite using the less-forgiving FIG. 14 pad layout. For example, the pad layout of FIG. 14 may be applied to some or all of tongues 260, 262, and 264 of card 252. When the mechanical retainer 202 is rotated clockwise to insert the board 254 into the connectors, the contacts in the connectors are placed on the shortened signal pads 508, and positive force is maintained on the card 252 to aid in keeping the card seated.

CONCLUSION

With the combination of the mechanical retainer 202 and the pad layout 502, potential benefits possibly include: increasing (or maximizing) signal density on a connector while maintaining acceptable crosstalk; having just a single reference pad (e.g. ground) between signal pairs; tight seating of board and controlled mating; preventing boards from unseating over time; providing high, controlled torque to mate a card with a high input/output connector count; using up less card edge area than traditional ejectors; a notch in the leading edge of the signal pads to reduce lateral misalignment when mating with a connector.

However, although there may be a benefit to the combination of the mechanical retainer 202 and the pad layout 502, more generally the mechanical retainers contemplated herein may be used independent of any particular pad layout, and the pad layouts discussed herein may be used independent of which (if any) mechanical retainer is used to assist in connecting the board to the connector(s).

Although the foregoing has been described with reference to certain specific embodiments, various modifications thereof will be apparent to those skilled in the art without departing from the scope of the claims appended hereto.

In particular, various broad embodiments are contemplated such that the disclosure is not to be limited by only the illustrated embodiments.

For example, in one embodiment, there is disclosed more generally a printed circuit board including a row of electrically conductive pads, the row of electrically conductive pads having pairs of signal pads with exactly one reference pad interposed between each pair of the signal pads. In some embodiments, for at least one pair of the signal pads, each signal pad of the at least one pair has a pad area that is smaller than a pad area of an adjacent reference pad. In some embodiments, each signal pad of the at least one pair has a pad length that is shorter than a pad length of the adjacent reference pad. In some embodiments, the adjacent reference pad is closer to the leading edge than each signal pad of the at least one pair. In some embodiments, each signal pad of the at least one pair of signal pads has a pad width that is shorter than a pad width of the adjacent reference pad. In some embodiments, each signal pad of the at least one pair of signal pads has a notch at a leading edge of the signal pad. In some embodiments, there is a gap between a first pair of signal pads and a second pair of signal pads, the gap having no signal pads and having exactly one reference pad, and the gap being more than 2.5 times the width (e.g. 2.7 times the width) of a signal pad in any of the first pair and the second pair.

As another example, in another embodiment, there is disclosed a mechanical retainer having a longitudinal body comprising a threaded end, a head at an end opposite the threaded end, and a shank connecting the head to the threaded end. The shank has two axially spaced and radially extending abutment surfaces. In some embodiments, the abutment surfaces are closer to the threaded end of the retainer than the head of the retainer. In some embodiments, one of the abutment surfaces is adjacent the threaded end. In some embodiments, there is an annular groove in the shank between the two abutment surfaces. In some embodiments, the annular groove defines the two abutment surfaces. In some embodiments the mechanical retainer further includes another annular groove in the shank that is located adjacent to the head of the retainer. In some embodiments the mechanical retainer further includes an additional annular groove interposed between the head and the threaded end. In some embodiments, the length of the shank is several times longer than the length of the threaded end.

As another example, in another embodiment, there is disclosed a bracket having a base and a saddle extending from the base, the saddle defining a channel having a longitudinal axis. In some embodiments, the saddle includes an inset wall, face, or surface forming an abutment face in a plane perpendicular to the longitudinal axis of the channel. In some embodiments, the saddle is U-shaped. The inset sidewall may also be U-shaped. In some embodiments the bracket further includes an aperture in the saddle that faces in a direction substantially perpendicular to the longitudinal axis of the channel. The aperture may be located above the channel. The aperture is to receive an insert, such as a screw, bolt, peg, or equivalent that, when inserted through the aperture extends across the channel substantially perpendicular to the longitudinal axis of the channel.

As another example, a kit is also contemplated including a printed circuit board and a mechanical retainer. The kit may further include a bracket. The printed circuit board may have a pad layout as contemplated herein. The mechanical retainer may have a design as contemplated herein. The bracket may have a design as contemplated herein.

As another example, rather than the specific card discussed above in relation to some of the figures, there is provided more broadly an apparatus including a printed circuit board having a leading edge and an opposite trailing edge, with a plurality of pads at the leading edge, and a mechanical retainer having a longitudinal body comprising a shank extending between a head and a threaded end, the head located at the trailing edge of the printed circuit board and the threaded end located at the leading edge of the printed circuit board. In some embodiments, the apparatus may further include a support or bracket connected to the printed circuit board that receives and supports the mechanical retainer. The bracket may comprise a channel in which the shank of the mechanical retainer is seated. The shank of may comprise an annular groove that is seated in the channel. The bracket (or specifically the saddle of the bracket) may have an inset wall, surface, or face forming an abutment face/surface in a plane perpendicular to a longitudinal axis of the shank. In some embodiments, the shank has two axially spaced and radially extending abutment surfaces, the two axially spaced and radially extending abutment surfaces comprising a first abutment surface closer to the leading edge of the printed circuit board, and a second abutment surface closer to the trailing edge of the printed circuit board. The bracket limits movement of one of the abutment surfaces of the mechanical retainer in a direction away from the leading edge of the printed circuit board, and the bracket also limits movement of the other abutment surface of the mechanical retainer in a direction towards the leading edge of the printed circuit board. In some embodiments, the bracket is connected to the printed circuit board adjacent the leading edge of the printed circuit board. In some embodiments, the mechanical retainer comprises an annular groove supported at the trailing edge of the printed circuit board. In some embodiments, the apparatus further includes a plate at the trailing edge of the printed circuit board, the plate having an aperture that exposes the head of the mechanical retainer and that supports the mechanical retainer at the trailing edge of the printed circuit board. In some embodiments, the printed circuit board has a plurality of tongues at the leading edge of the printed circuit board (and not necessarily 3 tongues, as in the illustrated embodiment). Each tongue of the plurality of tongues includes electrically conductive pads at the leading edge, and in some embodiments the mechanical retainer is interposed between two tongues. In some embodiments, the shank has at least one recessed portion or groove to accommodate one or more circuit components mounted on the printed circuit board.

Finally, there are also disclosed methods of constructing an apparatus, inserting the tongue(s) of a board into one or more connectors, and removing the tongue(s) of the board from the one or more connectors. For example, in one embodiment a method for constructing an apparatus is disclosed comprising: connecting a bracket to a printed circuit board, and supporting a mechanical retainer by at least the bracket. The printed circuit board and/or mechanical retainer and/or bracket may have any one of the designs contemplated herein. In another embodiment there is provided a method of interconnecting first and second PCBs, comprising: at the trailing edge of the first PCB, moving the head of a mechanical retainer to apply a force at a point closer to or adjacent to the leading edge of the first PCB, the force in the direction of the leading edge, to draw the leading edge towards one or more connectors. In another embodiment there is provided a method of removing an interconnection between first and second PCBs, comprising: at the trailing edge of the first PCB, moving the head of a mechanical retainer to apply a force at a point closer to or adjacent to the leading edge of the first PCB, the force in the direction of the trailing edge, to draw the leading edge away from one or more connectors.

The invention claimed is:
1. An apparatus comprising:
a printed circuit board having a leading edge and an opposite trailing edge, wherein the printed circuit board has a plurality of tongues at the leading edge of the printed circuit board, each tongue of the plurality of tongues including a row of electrically conductive pads at the leading edge of the printed circuit board; and a mechanical retainer interposed between two of the plurality of tongues, the mechanical retainer having a longitudinal body comprising a shank extending between a head and a threaded end, the head at the trailing edge of the printed circuit board and the threaded end at the leading edge of the printed circuit board, wherein the electrically conductive pads comprise at least two pairs of signal pads with a single reference pad interposed between each pair of the at least two pairs of signal pads, wherein each pair of the at least two pairs of signal pads is configured to transmit a differential data signal, and wherein the single reference pad with each pair of the at least two pairs of signal pads is connected to ground or power.

2. The apparatus of claim 1, wherein the shank of the mechanical retainer includes two axially spaced and radially extending abutment surfaces, and wherein a bracket connected to the printed circuit board limits movement of one of the abutment surfaces of the mechanical retainer in a direction away from the leading edge of the printed circuit board, and wherein the bracket also limits movement of the other abutment surface of the mechanical retainer in a direction towards the leading edge of the printed circuit board.

3. The apparatus of claim 2, wherein the bracket also receives and supports the mechanical retainer.

4. The apparatus of claim 3, wherein the bracket has an inset sidewall forming an abutment face in a plane perpendicular to a longitudinal axis of the shank, and wherein the inset sidewall limits the movement of the one abutment surface of the mechanical retainer in the direction away from the leading edge of the printed circuit board.

5. The apparatus of claim 2, wherein:
the shank of the mechanical retainer comprises an annular groove defined between the two axially spaced and radially extending abutment surfaces;
the bracket defines a channel; and
the annular groove of the shank is seated in the channel.

6. The apparatus of claim 2, wherein the bracket is connected to the printed circuit board adjacent the leading edge of the printed circuit board, and one abutment surface of the shank of the mechanical retainer is adjacent the threaded end of the mechanical retainer.

7. The apparatus of claim 1, wherein the apparatus further comprises a plate at the trailing edge of the printed circuit board, the plate having an aperture that exposes the head of the mechanical retainer and that supports the mechanical retainer at the trailing edge of the printed circuit board.

8. The apparatus of claim 1, wherein the shank has at least one recessed portion or groove to accommodate a circuit component mounted on the printed circuit board.

9. The apparatus of claim 1, wherein each signal pad of at least one pair of the at least two pairs of signal pads has a pad area that is smaller than a pad area of an adjacent reference pad.

10. The apparatus of claim 9, wherein each signal pad of the at least one pair has a pad length that is shorter than a pad length of the adjacent reference pad.

11. The apparatus of claim 10, wherein the adjacent reference pad is closer to the leading edge than each signal pad of the at least one pair.

12. The apparatus of claim 9, wherein each signal pad of the at least one pair of signal pads has a pad width that is smaller than a pad width of the adjacent reference pad.

13. The apparatus of claim 9, wherein each signal pad of the at least one pair of signal pads has a notch at a leading edge of the signal pad.

14. The apparatus of claim 13, wherein the notch has an inverted triangle shape or a scalloped shape.

15. The apparatus of claim 1, wherein the printed circuit board has a gap between a first pair of signal pads and a second pair of signal pads, the gap having no signal pads and including exactly one reference pad, and the gap being more than 2.5 times the width of a signal pad in any of the first pair and the second pair.

16. A kit comprising:
a printed circuit board having a leading edge and an opposite trailing edge, wherein the printed circuit board has a plurality of tongues at the leading edge of the printed circuit board, each tongue of the plurality of tongues including a row of electrically conductive pads at the leading edge of the printed circuit board, and wherein at least some of the electrically conductive pads comprise pairs of signal pads with exactly one reference pad interposed between each pair of the signal pads, wherein each of the pairs of the signal pads is configured to transmit a differential data signal, and wherein each reference pad is connected to ground or power; and
a mechanical retainer for placement between two of the tongues, the mechanical retainer having a longitudinal body comprising a shank extending between a head and a threaded end, the head for placement at the trailing edge of the printed circuit board and the threaded end for placement at the leading edge of the printed circuit board.

17. The kit of claim 16, wherein the shank of the mechanical retainer includes two axially spaced and radially extending abutment surfaces, and wherein the kit further includes a bracket for connection to the printed circuit board, the bracket to limit movement of one of the abutment surfaces of the mechanical retainer in a direction away from the leading edge of the printed circuit board, and the bracket to limit movement of the other abutment surface of the mechanical retainer in a direction towards the leading edge of the printed circuit board.

18. The kit of claim 17, wherein the bracket has an inset sidewall forming an abutment face in a plane that is to be perpendicular to a longitudinal axis of the shank, and wherein the inset sidewall is to limit the movement of the one abutment surface of the mechanical retainer in the direction away from the leading edge of the printed circuit board.

19. The kit of claim 16, wherein for at least one pair of the signal pads, each signal pad of the at least one pair has a pad area that is smaller than a pad area of an adjacent reference pad.

20. The kit of claim 16, wherein each signal pad of the at least one pair has a pad length that is shorter than a pad length of the adjacent reference pad.

* * * * *